US008518170B2

(12) United States Patent
Leung et al.

(10) Patent No.: US 8,518,170 B2
(45) Date of Patent: Aug. 27, 2013

(54) BORON-COMPRISING INKS FOR FORMING BORON-DOPED REGIONS IN SEMICONDUCTOR SUBSTRATES USING NON-CONTACT PRINTING PROCESSES AND METHODS FOR FABRICATING SUCH BORON-COMPRISING INKS

(75) Inventors: Roger Yu-Kwan Leung, San Jose, CA (US); De-Ling Zhou, Sunnyvale, CA (US); Wenya Fan, Campbell, CA (US)

(73) Assignee: Honeywell International Inc., Morristown, NJ (US)

( * ) Notice: Subject to any disclaimer, the term of this patent is extended or adjusted under 35 U.S.C. 154(b) by 771 days.

(21) Appl. No.: 12/344,745

(22) Filed: Dec. 29, 2008

(65) Prior Publication Data
US 2010/0162920 A1    Jul. 1, 2010

(51) Int. Cl.
*C09D 11/02* (2006.01)
(52) U.S. Cl.
USPC .................................. 106/31.92; 106/31.13
(58) Field of Classification Search
USPC ................. 106/31.13, 31.85, 31.92
See application file for complete search history.

(56) References Cited

U.S. PATENT DOCUMENTS

| | | |
|---|---|---|
| 3,258,434 A | 6/1966 | MacKenzie et al. |
| 3,877,956 A | 4/1975 | Nitzsche et al. |
| 3,960,605 A | 6/1976 | Beck et al. |
| 4,030,938 A | 6/1977 | Thomas |
| 4,072,636 A | 2/1978 | Ashida et al. |
| 4,102,766 A | 7/1978 | Fey |
| 4,104,091 A * | 8/1978 | Evans et al. ............... 438/57 |
| 4,236,948 A | 12/1980 | Seibold et al. |
| 4,243,427 A | 1/1981 | DiBugnara |
| 4,392,180 A | 7/1983 | Nair |
| 4,478,879 A | 10/1984 | Baraona et al. |
| 4,517,403 A | 5/1985 | Morel et al. |
| 4,548,741 A | 10/1985 | Hormadaly |
| 4,578,283 A * | 3/1986 | Kirtley et al. ............. 438/562 |
| 4,707,346 A | 11/1987 | Hormadaly |
| 4,793,862 A | 12/1988 | Ishikawa et al. |
| 4,891,331 A | 1/1990 | Rapp |
| 4,927,770 A | 5/1990 | Swanson |
| 5,053,083 A | 10/1991 | Sinton |
| 5,152,819 A | 10/1992 | Blackwell et al. |
| 5,302,198 A | 4/1994 | Allman |
| 5,399,185 A | 3/1995 | Berthold et al. |
| 5,464,564 A | 11/1995 | Brown |
| 5,472,488 A | 12/1995 | Allman |
| 5,510,271 A | 4/1996 | Rohatgi et al. |
| 5,527,389 A | 6/1996 | Rosenblum |
| 5,527,872 A | 6/1996 | Allman |
| 5,591,565 A | 1/1997 | Holdermann et al. |
| 5,614,018 A | 3/1997 | Azuma et al. |
| 5,641,362 A | 6/1997 | Meier |
| 5,661,041 A | 8/1997 | Kano |
| 5,665,845 A | 9/1997 | Allman |
| 5,667,597 A | 9/1997 | Ishihara |
| 5,695,809 A | 12/1997 | Chadha et al. |
| 5,766,964 A | 6/1998 | Rohatgi et al. |
| 5,899,704 A | 5/1999 | Schlosser et al. |
| 5,928,438 A | 7/1999 | Salami et al. |
| 6,091,021 A | 7/2000 | Ruby et al. |
| 6,096,968 A | 8/2000 | Schlosser et al. |
| 6,099,647 A | 8/2000 | Yieh et al. |
| 6,143,976 A | 11/2000 | Endros |
| 6,162,658 A | 12/2000 | Green et al. |
| 6,180,869 B1 | 1/2001 | Meier et al. |
| 6,200,680 B1 | 3/2001 | Takeda et al. |
| 6,221,719 B1 | 4/2001 | Franco |
| 6,232,207 B1 | 5/2001 | Schindler |
| 6,251,756 B1 | 6/2001 | Horzel et al. |
| 6,262,359 B1 | 7/2001 | Meier et al. |
| 6,297,134 B1 | 10/2001 | Ui et al. |
| 6,300,267 B1 | 10/2001 | Chen et al. |
| 6,309,060 B1 | 10/2001 | Timmermans-Wang et al. |
| 6,355,581 B1 | 3/2002 | Vassiliev et al. |
| 6,384,317 B1 | 5/2002 | Kerschaver et al. |

(Continued)

FOREIGN PATENT DOCUMENTS

| | | |
|---|---|---|
| CN | 101369612 | 2/2009 |
| CN | 101414647 A | 4/2009 |

(Continued)

OTHER PUBLICATIONS

Techniglas Technical Products, Boron Plus, Product Information. pp. 1-3.
BoronPlus, High Purity Planar Dopants, ISO Certified 3002/14001, Techneglas Technical Products, 2000.
Zable, J.L., Splatter During Ink Jet Printing, IBM J. Res. Develop., Jul. 1977, pp. 315-320.
B-30, B-40, B-50, B-60 Spin-On Dopants, Material Safety Data Sheet, Honeywell International, Apr. 29, 2003, pp. 1-7.
ACCUSPIN Boron; Polymers for All P-Type Diffusion, Honeywell International, 2005, pp. 1-2.
Spin-On Dopants, Thin Film—Dielectrics, Application Comparision, Honeywell International, 2002, pp. 1-2.
Ruge, Ingolf et al. "Halbleiter Technologie," Publication: Berlin; New York: Springer-Verlag; Edition: 2., überarbeitete und erw. Aufl. / von Hermann Mader. Year: 1984; Description: 404 p. 218 ill. ; 24 cm.; Language: German; Series: Halbleiter-Elektronik; Bd. 4; Variation: Halbleiter-Elektronik ;; Bd. 4. Standard No. ISBN: 0387126619 (U.S.); 9780387126616 (U.S.); 3540126619; 9783540126614; National Library: 831027150 LCCN: 85-106745.

(Continued)

*Primary Examiner* — Lorna M Douyon
*Assistant Examiner* — Amina Khan
(74) *Attorney, Agent, or Firm* — Ingrassia Fisher & Lorenz PC

(57) ABSTRACT

Boron-comprising inks for forming boron-doped regions in semiconductor substrates using non-contact printing processes and methods for fabricating such boron-comprising inks are provided. A boron-comprising ink comprises boron from or of a boron-comprising material and a spread-minimizing additive that results in a spreading factor of the boron-comprising ink in a range of from about 1.5 to about 6. The boron-comprising ink has a viscosity in a range of from about 1.5 to about 50 centipoise and, when deposited on a semiconductor substrate, provides a post-anneal sheet resistance in a range of from about 10 to about 100 ohms/square, a post-anneal doping depth in a range of from about 0.1 to about 1 μm, and a boron concentration in a range of from about $1\times10^{19}$ to $1\times10^{20}$ atoms/cm$^3$.

17 Claims, 5 Drawing Sheets

(56) References Cited

U.S. PATENT DOCUMENTS

| | | |
|---|---|---|
| 6,429,037 B1 | 8/2002 | Wenham et al. |
| 6,479,885 B2 | 11/2002 | Buchanan et al. |
| 6,518,087 B1 | 2/2003 | Furusawa et al. |
| 6,524,880 B2 | 2/2003 | Moon et al. |
| 6,552,414 B1 | 4/2003 | Horzel et al. |
| 6,632,730 B1 | 10/2003 | Meier et al. |
| 6,664,631 B2 | 12/2003 | Meier et al. |
| 6,695,903 B1 | 2/2004 | Kubelbeck et al. |
| 6,703,295 B2 | 3/2004 | Meier et al. |
| 6,737,340 B2 | 5/2004 | Meier et al. |
| 6,756,290 B1 | 6/2004 | Bultman |
| 6,773,994 B2 | 8/2004 | Chittipeddi et al. |
| 6,784,520 B2 | 8/2004 | Doi |
| 6,825,104 B2 | 11/2004 | Horzel et al. |
| 6,960,546 B2 | 11/2005 | Caspers et al. |
| 6,998,288 B1 | 2/2006 | Smith et al. |
| 7,029,943 B2 | 4/2006 | Kruhler |
| 7,041,549 B2 | 5/2006 | Ootsuka |
| 7,078,276 B1 | 7/2006 | Zurcher et al. |
| 7,078,324 B2 | 7/2006 | Dudek et al. |
| 7,097,788 B2 | 8/2006 | Kirkor et al. |
| 7,108,733 B2 | 9/2006 | Enokido |
| 7,115,216 B2 | 10/2006 | Carter et al. |
| 7,129,109 B2 | 10/2006 | Munzer et al. |
| 7,135,350 B1 | 11/2006 | Smith et al. |
| 7,144,751 B2 | 12/2006 | Gee et al. |
| 7,170,001 B2 | 1/2007 | Gee et al. |
| 7,186,358 B2 | 3/2007 | McCulloch et al. |
| 7,196,018 B2 | 3/2007 | Szlufcik et al. |
| 7,217,883 B2 | 5/2007 | Munzer |
| 7,278,728 B2 | 10/2007 | Desie et al. |
| 7,332,445 B2 | 2/2008 | Lukas et al. |
| 7,335,555 B2 | 2/2008 | Gee et al. |
| 7,393,464 B2 | 7/2008 | Wenderoth et al. |
| 7,393,723 B2 | 7/2008 | Yamazaki et al. |
| 7,402,448 B2 | 7/2008 | Narayanan et al. |
| 7,456,084 B2 | 11/2008 | Jonczyk et al. |
| 7,459,391 B2 | 12/2008 | Yoshizawa et al. |
| 7,468,485 B1 | 12/2008 | Swanson |
| 7,537,951 B2 | 5/2009 | Gambino et al. |
| 7,559,494 B1 | 7/2009 | Yadav et al. |
| 7,572,740 B2 | 8/2009 | Terry et al. |
| 7,615,393 B1 | 11/2009 | Shah et al. |
| 7,633,006 B1 | 12/2009 | Swanson |
| 7,635,600 B2 | 12/2009 | Zhang et al. |
| 7,638,438 B2 | 12/2009 | Eldershaw |
| 7,867,960 B2 | 1/2011 | Yamaguchi et al. |
| 8,053,867 B2 | 11/2011 | Huang et al. |
| 8,138,070 B2 | 3/2012 | Kelman et al. |
| 2002/0046765 A1 | 4/2002 | Uematsu et al. |
| 2002/0153039 A1 | 10/2002 | Moon et al. |
| 2003/0134469 A1 | 7/2003 | Horzel et al. |
| 2003/0153141 A1 | 8/2003 | Carter et al. |
| 2004/0028971 A1 | 2/2004 | Wenderoth et al. |
| 2004/0063326 A1 | 4/2004 | Szlufcik et al. |
| 2004/0112426 A1 | 6/2004 | Hagino |
| 2004/0242019 A1 | 12/2004 | Klein et al. |
| 2004/0261839 A1 | 12/2004 | Gee et al. |
| 2004/0261840 A1 | 12/2004 | Schmit et al. |
| 2005/0014359 A1 | 1/2005 | Segawa et al. |
| 2005/0189015 A1 | 9/2005 | Rohatgi et al. |
| 2005/0190245 A1 | 9/2005 | Desie et al. |
| 2005/0268963 A1 | 12/2005 | Jordan et al. |
| 2006/0060238 A1 | 3/2006 | Hacke et al. |
| 2006/0105581 A1 | 5/2006 | Bielefeld et al. |
| 2006/0162766 A1 | 7/2006 | Gee et al. |
| 2006/0163744 A1 | 7/2006 | Vanheusden et al. |
| 2006/0166429 A1 | 7/2006 | Chaudhry et al. |
| 2006/0222869 A1 | 10/2006 | Cai et al. |
| 2006/0237719 A1 | 10/2006 | Colfer et al. |
| 2006/0258820 A1 | 11/2006 | Schneider |
| 2007/0012355 A1 | 1/2007 | LoCascio et al. |
| 2007/0034251 A1 | 2/2007 | Jonczyk et al. |
| 2007/0075416 A1 | 4/2007 | Anderson et al. |
| 2007/0151598 A1 | 7/2007 | De Ceuster et al. |
| 2007/0157965 A1 | 7/2007 | Park |
| 2007/0215203 A1 | 9/2007 | Ishikawa et al. |
| 2007/0269923 A1 | 11/2007 | Lee et al. |
| 2007/0290283 A1 | 12/2007 | Park et al. |
| 2008/0024752 A1* | 1/2008 | Ng et al. ................. 355/132 |
| 2008/0026550 A1 | 1/2008 | Werner et al. |
| 2008/0036799 A1* | 2/2008 | Ittel ................. 347/2 |
| 2008/0042212 A1 | 2/2008 | Kamath et al. |
| 2008/0044964 A1 | 2/2008 | Kamath et al. |
| 2008/0048240 A1 | 2/2008 | Kamath et al. |
| 2008/0058231 A1 | 3/2008 | Yamaguchi et al. |
| 2008/0058232 A1 | 3/2008 | Yamaguchi et al. |
| 2008/0064813 A1 | 3/2008 | Schneider |
| 2008/0076240 A1 | 3/2008 | Veschetti et al. |
| 2008/0092944 A1 | 4/2008 | Rubin |
| 2008/0107814 A1 | 5/2008 | Wierer et al. |
| 2008/0107815 A1 | 5/2008 | Schneider et al. |
| 2008/0119593 A1 | 5/2008 | Stramel et al. |
| 2008/0121279 A1 | 5/2008 | Swanson |
| 2008/0138456 A1 | 6/2008 | Fork et al. |
| 2008/0142075 A1 | 6/2008 | Reddy et al. |
| 2008/0160733 A1 | 7/2008 | Hieslmair et al. |
| 2008/0199687 A1* | 8/2008 | Chiruvolu et al. ............. 428/331 |
| 2008/0202576 A1 | 8/2008 | Hieslmair |
| 2008/0210298 A1 | 9/2008 | Kuebelbeck et al. |
| 2008/0241986 A1 | 10/2008 | Rohatgi et al. |
| 2008/0241987 A1 | 10/2008 | Rohatgi et al. |
| 2008/0241988 A1 | 10/2008 | Rohatgi et al. |
| 2008/0251121 A1 | 10/2008 | Stone |
| 2008/0264332 A1 | 10/2008 | Sepehry-Fard |
| 2008/0268584 A1 | 10/2008 | Anderson et al. |
| 2008/0290368 A1 | 11/2008 | Rubin |
| 2008/0314288 A1 | 12/2008 | Biro et al. |
| 2009/0007962 A1 | 1/2009 | Wenham et al. |
| 2009/0007965 A1 | 1/2009 | Rohatgi et al. |
| 2009/0017606 A1 | 1/2009 | Fath et al. |
| 2009/0020156 A1 | 1/2009 | Ohtsuka et al. |
| 2009/0020829 A1 | 1/2009 | Chandra et al. |
| 2009/0068474 A1 | 3/2009 | Lower et al. |
| 2009/0068783 A1 | 3/2009 | Borden |
| 2009/0084440 A1 | 4/2009 | Wang et al. |
| 2009/0142565 A1 | 6/2009 | Takahashi et al. |
| 2009/0142875 A1 | 6/2009 | Borden et al. |
| 2009/0142911 A1 | 6/2009 | Asano et al. |
| 2009/0149554 A1 | 6/2009 | Ishikawa et al. |
| 2009/0183768 A1 | 7/2009 | Wenham et al. |
| 2009/0194153 A1 | 8/2009 | Hilali et al. |
| 2009/0226609 A1 | 9/2009 | Boisvert et al. |
| 2009/0227061 A1 | 9/2009 | Bateman et al. |
| 2009/0227097 A1 | 9/2009 | Bateman et al. |
| 2009/0233426 A1 | 9/2009 | Poplavskyy et al. |
| 2009/0239330 A1 | 9/2009 | Vanheusden et al. |
| 2009/0239363 A1 | 9/2009 | Leung et al. |
| 2009/0260684 A1 | 10/2009 | You |
| 2009/0292053 A1 | 11/2009 | Morita |
| 2009/0308440 A1 | 12/2009 | Adibi et al. |
| 2009/0314341 A1 | 12/2009 | Borden et al. |
| 2009/0314344 A1 | 12/2009 | Fork et al. |
| 2010/0016200 A1 | 1/2010 | Nagare et al. |
| 2010/0068848 A1 | 3/2010 | Kuo et al. |
| 2010/0175744 A1 | 7/2010 | Hirai et al. |
| 2010/0261347 A1 | 10/2010 | Nobutoh |
| 2010/0319771 A1 | 12/2010 | Mihailetchi et al. |
| 2011/0021012 A1 | 1/2011 | Leung et al. |
| 2011/0021736 A1 | 1/2011 | Zhu |
| 2011/0045624 A1 | 2/2011 | Tsukigata et al. |
| 2011/0195541 A1 | 8/2011 | Machii et al. |
| 2011/0240997 A1 | 10/2011 | Rockenberger et al. |
| 2011/0256658 A1 | 10/2011 | Machii et al. |
| 2012/0006393 A1 | 1/2012 | Cruz et al. |
| 2012/0222734 A1 | 9/2012 | Kano et al. |

FOREIGN PATENT DOCUMENTS

| | | |
|---|---|---|
| CN | 101777606 A | 7/2010 |
| CN | 101937940 A | 1/2011 |
| CN | 102097525 A | 6/2011 |
| CN | 102263159 A | 11/2011 |
| EP | 0195148 A1 | 9/1986 |
| EP | 0381430 A2 | 1/1990 |

| | | | |
|---|---|---|---|
| EP | 485122 A1 | 5/1992 |
| EP | 0890980 A2 | 1/1999 |
| EP | 999598 A1 | 5/2000 |
| EP | 1024523 A1 | 8/2000 |
| EP | 0770265 B1 | 3/2002 |
| EP | 1843389 A1 | 10/2007 |
| EP | 1876651 A1 | 1/2008 |
| GB | 1250585 | 12/1968 |
| JP | 09-036853 A | 11/1997 |
| JP | 2003168807 | 6/2003 |
| JP | 2003168810 | 6/2003 |
| JP | 2003-188393 A | 7/2003 |
| JP | 2003224285 | 8/2003 |
| JP | 2004221149 | 8/2004 |
| JP | 2005038997 | 2/2005 |
| JP | 2007081300 | 3/2007 |
| JP | 2011187894 A2 | 9/2011 |
| KR | 1019890016644 A | 11/1989 |
| KR | 10-199-0066346 A1 | 8/1999 |
| KR | 101054985 B1 | 8/2011 |
| KR | 101165915 B1 | 7/2012 |
| WO | 9715075 | 4/1997 |
| WO | 2006029250 A2 | 3/2006 |
| WO | 2006131251 A1 | 12/2006 |
| WO | 2007059577 A1 | 5/2007 |
| WO | 2007059578 A1 | 5/2007 |
| WO | 2007106502 A2 | 9/2007 |
| WO | 2007-111996 A2 | 10/2007 |
| WO | 2007118121 A2 | 10/2007 |
| WO | 2007-129966 A1 | 11/2007 |
| WO | 2008039078 A2 | 4/2008 |
| WO | 2008054473 A2 | 5/2008 |
| WO | 2008085806 A1 | 7/2008 |
| WO | 2008098407 A2 | 8/2008 |
| WO | 2008141415 A1 | 11/2008 |
| WO | 2009010585 A2 | 1/2009 |
| WO | 2009013307 A2 | 1/2009 |
| WO | 2009032359 A2 | 3/2009 |
| WO | 2009052511 A2 | 4/2009 |
| WO | 2009067005 A1 | 5/2009 |
| WO | 2009085224 A2 | 7/2009 |
| WO | 2009088138 A1 | 7/2009 |
| WO | 2009094575 A2 | 7/2009 |
| WO | 2009107920 A1 | 9/2009 |
| WO | 2009116569 A1 | 9/2009 |
| WO | 2009126803 A2 | 10/2009 |
| WO | 2009152378 A1 | 12/2009 |
| WO | 2010089654 A1 | 8/2010 |

OTHER PUBLICATIONS

A simple processing sequence for selective emitters[Si solarcells]; Horzel, J., Szlufcik, J., Nijs J., Mertens, R, Imec, Heverlee; Photovoltaic Specialists Conference, 1997., Conference Record of the Twenty-Sixth IEEE; Sep. 29-Oct. 3, 1997; pp. 139-142; Meeting Date: Sep. 29, 1997-Oct. 3, 1997; Location: Anaheim, CA USA.
Accuglass P-114A Spin-On Glass, Material Safety Data Sheet, Honeywell International, Oct. 29, 2003, pp. 1-6.
Accuglass P-5S, Product Bulletin, Thin-Film Dielectrics, Honeywell International, 2002, pp. 1-2.
Accuglass P-TTY A Series Phosphosilicate Spin-On Glasses, Allied Signal Inc. Planarization and Diffusion Products, May 1992, pp. 1-2.
Accuglass P-TTY Product Bulletin, Thin-Film Dielectrics, Honeywell International 2002, pp. 1-2.
Accuglass P-XXY Spin-On Glass, Material Safety Data Sheet, Honeywell International, May 14, 2003, pp. 1-7.
Diffusion Technology Phosphorus Spin-On Dopants P-8 Series (P-8545, P-854 (2:1), Material Safety Data Sheet, Honeywell International, Apr. 25, 2003, pp. 1-7.
Horzel, J. et al., A Simple Processing Sequence for Selective Emitters, 26th PVSC, Sep. 30-Oct. 3, 1997.
Tonooka, K.; Shimokawa, K; Nishimura, O Fluorescent Properties of Tb-doped Borosilicate Glass Films Prepared by a Sol-gel Method Proceedings of SPIE—The International Society for Optical Engineering, v 4282, p. 193-199, 2001.
Yun, Yongsup; Yoshida, Takanori; Shimazu, Norifumi; Inoue, Yasishi; Saito, Nagahiro; Takai, Osamu Behavior of Various Organosilicon Molecules in PECVD Processes for Hydrocarbon-doped Silicaon Oxide Films Diffusion and Defect Data Pt.B Solid State Phenomena, v 124-126, n PART 1, p. 347-350, 2007, Advances in Nanomaterials and Processing—IUMRS.
Tajima, Nobuo; Ohno, Takahisa; Hamada, Tomoyuki; Yoneda, Katsumi; Kondo, Seiichi; Kobayashi, Nobuyoshi; Shinriki, Manabu; Inaishi, Yoshiaki; Miyazawa, Kazuhiro; Sakota, Kaoru; Hasaka, Satoshi; Inoue, Minoru Carbon-doped Silicon Oxide Films with Hydrocarbon Network Bonds for Low-k Dielectrics, theoretical Investigations Japanese Journal of Applied Physics, Part 1: Regular Papers and Short Notes and Review Papers, v 46, n 9A, p.
Takea, Satoshi1; Fukawa, Makoto1 Surface Modification of Sputtered SiO2 Thin Films by Metal Doping Materials Research Society Symposium—Proceedings, v 750, p. 443-448, 2002.
Sabbah, H.; Conde, J.P.; Chu, V.; Zebda, A.; Ababou-Girard, S.; Solal, F.; Godet, C. Thermal Grafting of Fluorinated Molecular Monolayers on Doped Amorphous Silicon surfaces Journal of Applied Physics, v 105, n 6, 2009.
Osada, Yoshihito; Takase, Mitsuo Plasma-polymerized Organosilioxane Membranes Prepared by Simultaneous Doping of i2 Molecules and the Effect on Liquid Permeability Journal of Polymer Science, Part A-1, Polymer Chemistry, v 23, n 9, p. 2425-2439, Sep. 1985.
Popov, V.P.1; Safronov, L.N.1; Nikiforov, A.I.1 Atomically Flat Surface of Hydrogen Transferred Si Film with Boron Delta Doped Layer Meeting Abstracts, p. 526, 2005, 207th Meeting of the Electrochemical Society—Meeting Abstracts.
Li, Jiangtian1; Shi, Jianlin1; Zhang, Lingxia1; Hua, Zile1; Jiang, Peng1; Huang, Weimin1l Wei, Chenyang1 A Pre-modification-direct Synthesis Route for the Covalent Incorporation and Monomeric Dispersion of Hydrophobic Organic Chromophores in Mesoporous Silica Films Microporous and Mesoporous Materials, v 111, n 1-3, p. 150-156, Apr. 15, 2008.
Wang, C., et al., Photophysical Properties of Rare Earth (Eu3+, Sm3+, Tb3+) Complex Covalently Immobilized in Hybrid Si-O-B Xerogels, Journal of Fluorescence, 2011, pp. 1-9.
Smirnovam, I., et al., Investigation into the Surface Morphology of Nanosized Silicate and Hybrid Films by Optical and Atomic-Force Microscopy, Glass Physics and Chemistry, vol. 33, No. 4, 2007, pp. 306-314.
US Patent Office, "Office Action" mailed Jul. 5, 2012; U.S. Appl. No. 12/274,006, filed Nov. 19, 2008.
Edwards, M., "Screen-Print Selective Diffusions for High-Efficiency Industrial Silicon Solar Cells", Progress in Photovoltaics: Research and Applications, vol. 16, Issue 1, Jan. 2008, pp. 31-45.
Salami, J. "Diffusion Paste Development for Printable IBC and Bifacial Silicon Solar Cells", Conference Record of the 2006 IEEE 4th World Conference on Photovoltaic Energy Conversion, WCPEC-4, vol. 2, 2007, Article No. 4059888, pp. 1323-1325.
Written Opinion and International Search Report mailed Feb. 22, 2013 in International Application No. PCT/US2012/051719.
Written Opinion and International Search Report mailed Mar. 25, 2013 in International Application No. PCT/US2012/059847.

* cited by examiner

BORON-COMPRISING INKS FOR FORMING BORON-DOPED REGIONS IN SEMICONDUCTOR SUBSTRATES USING NON-CONTACT PRINTING PROCESSES AND METHODS FOR FABRICATING SUCH BORON-COMPRISING INKS

FIELD OF THE INVENTION

The present invention generally relates to dopants and methods for doping regions of semiconductor-comprising substrates, and more particularly relates to boron-comprising inks for forming boron-doped regions in semiconductor substrates using non-contact printing processes and methods for fabricating such boron-comprising inks.

BACKGROUND OF THE INVENTION

Doping of semiconductor substrates with conductivity-determining type impurities, such as n-type and p-type ions, is used in a variety of applications that require modification of the electrical characteristics of the semiconductor substrates. Well-known methods for performing such doping of semiconductor substrates include photolithography and screen printing. Photolithography requires the use of a mask that is formed and patterned on the semiconductor substrate. Ion implantation then is performed to implant conductivity-determining type ions into the semiconductor substrate in a manner corresponding to the mask. Similarly, screen printing utilizes a patterned screen that is placed on the semiconductor substrate. A screen printing paste containing the conductivity-determining type ions is applied to the semiconductor substrate over the screen so that the paste is deposited on the semiconductor substrate in a pattern that corresponds inversely to the screen pattern. After both methods, a high-temperature anneal is performed to cause the impurity dopants to diffuse into the semiconductor substrate.

In some applications such as, for example, solar cells, it is desirable to dope the semiconductor substrate in a pattern having very fine lines or features. The most common type of solar cell is configured as a large-area p-n junction made from silicon. In one type of such solar cell 10, illustrated in FIG. 1, a silicon wafer 12 having a light-receiving front side 14 and a back side 16 is provided with a basic doping, wherein the basic doping can be of the n-type or of the p-type. The silicon wafer is further doped at one side (in FIG. 1, front side 14) with a dopant of opposite charge of the basic doping, thus forming a p-n junction 18 within the silicon wafer. Photons from light are absorbed by the light-receiving side 14 of the silicon to the p-n junction where charge carriers, i.e., electrons and holes, are separated and conducted to a conductive contact, thus generating electricity. The solar cell is usually provided with metallic contacts 20, 22 on the light-receiving front side as well as on the back side, respectively, to carry away the electric current produced by the solar cell. The metal contacts on the light-receiving front side pose a problem in regard to the degree of efficiency of the solar cell because the metal covering of the front side surface causes shading of the effective area of the solar cell. Although it may be desirable to reduce the metal contacts as much as possible so as to reduce the shading, a metal covering of approximately 5% remains unavoidable since the metallization has to occur in a manner that keeps the electrical losses small. In addition, contact resistance within the silicon adjacent to the electrical contact increases significantly as the size of the metal contact decreases. However, a reduction of the contact resistance is possible by doping the silicon in narrow areas 24 directly adjacent to the metal contacts on the light-receiving front side 14.

FIG. 2 illustrates another common type of solar cell 30. Solar cell 30 also has a silicon wafer 12 having a light-receiving front side 14 and a back side 16 and is provided with a basic doping, wherein the basic doping can be of the n-type or of the p-type. The light-receiving front side 14 has a rough or textured surface that serves as a light trap, preventing absorbed light from being reflected back out of the solar cell. The metal contacts 32 of the solar cell are formed on the back side 16 of the wafer. The silicon wafer is doped at the backside relative to the metal contacts, thus forming p-n junctions 18 within the silicon wafer. Solar cell 30 has an advantage over solar cell 10 in that all of the metal contacts of the cell are on the back side 16. In this regard, there is no shading of the effective area of the solar cell. However, for all contacts to be formed on the back side 16, the doped regions adjacent to the contacts have to be quite narrow.

As noted above, both solar cell 10 and solar cell 30 benefit from the use of very fine, narrow doped regions formed within a semiconductor substrate. However, the present-day methods of doping described above, that is, photolithography and screen printing, present significant drawbacks. For example, it is prohibitively difficult, if not impossible, to obtain very fine and/or narrow doped regions in a semiconductor substrate using screen printing. In addition, while doping of substrates in fine-lined patterns is possible with photolithography, photolithography is an expensive and time consuming process. In addition, both photolithography and screen printing involve contact with the semiconductor substrate. However, in applications such as solar cells, the semiconductor substrates are becoming very thin. Contact with thin substrates often results in breaking of the substrates. Further, screen printing cannot be used to dope rough or textured surfaces, which are commonly used in solar cell design to trap light within the semiconductor substrate. Moreover, because photolithography and screen printings use custom designed masks and screens, respectively, to dope the semiconductor substrate in a pattern, reconfiguration of the doping pattern is expensive because new masks or screens have to be developed.

Accordingly, it is desirable to provide boron-comprising inks for forming boron-doped regions in semiconductor substrates using non-contact printing processes. It also is desirable to provide methods for fabricating boron-comprising inks for forming such boron-doped regions using non-contact printing. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A boron-comprising ink is provided in accordance with an exemplary embodiment of the present invention. The boron-comprising ink comprises boron from or of a boron-comprising material and a spread-minimizing additive that results in a spreading factor of the boron-comprising ink in a range of from about 1.5 to about 6. The boron-comprising ink has a viscosity in a range of from about 1.5 to about 50 centipoise and, when deposited on a semiconductor substrate, provides a post-anneal sheet resistance in a range of from about 10 to about 100 ohms/square, a post-anneal doping depth in a range of from about 0.1 to about 1 μm, and a boron concentration in a range of from about $1\times10^{19}$ to $1\times10^{20}$ atoms/cm$^3$.

A method for fabricating a boron-comprising ink is provided in accordance with an exemplary embodiment of the present invention. The method comprises the steps of providing a boron-comprising material, combining the boron-comprising material with a polar solvent having a boiling point in a range of about 50° C. to about 250° C., and combining the boron-comprising material with a spread-minimizing additive that results in a spreading factor of the boron-comprising ink in a range of from about 1.5 to about 6.

A method for formulating a boron-comprising ink is provided in accordance with another exemplary embodiment of the present invention. The method comprises the steps of combining an amine and a boron donor, heating the amine and the boron donor combination to form a polymeric borazole resin, adding a solvent having a boiling point in a range of about 50° C. to about 250° C. to the polymeric borazole resin, adding a spread-minimizing additive that results in a spreading factor of the boron-comprising ink in a range of from about 1.5 to about 6, and adding a viscosity modifier to the polymeric borazole resin. The viscosity modifier results in the boron-comprising ink having a viscosity in a range of from about 1.5 to about 50 centipoise.

A method for fabricating a boron-comprising ink is provided in accordance with a further exemplary embodiment of the present invention. The method comprises the steps of providing boron-comprising nanoparticles having an average dimension of no greater than 100 nm and combining the boron-comprising nanoparticles with a dispersant that forms a uniform and stable suspension with the boron-comprising nanoparticles. A spread-minimizing additive that results in a spreading factor of the boron-comprising ink in a range of from about 1.5 to about 6 is added.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
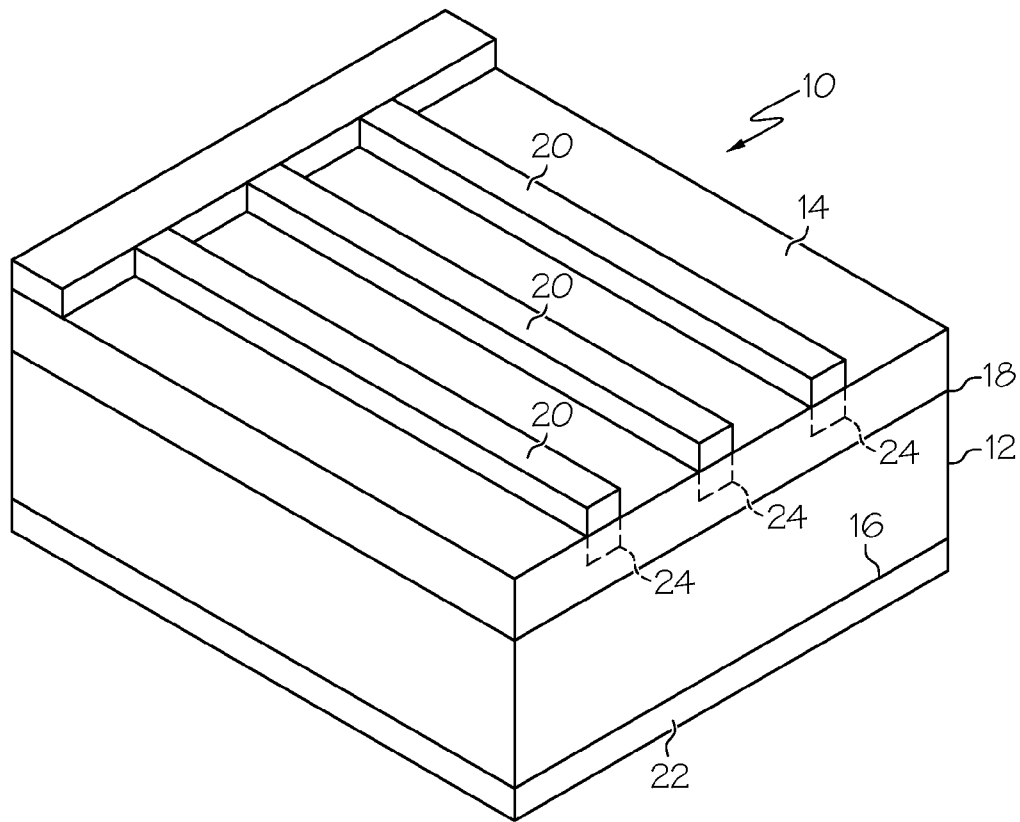
FIG. 1 is a schematic illustration of a conventional solar cell with a light-side contact and a back side contact.
Figure 2:
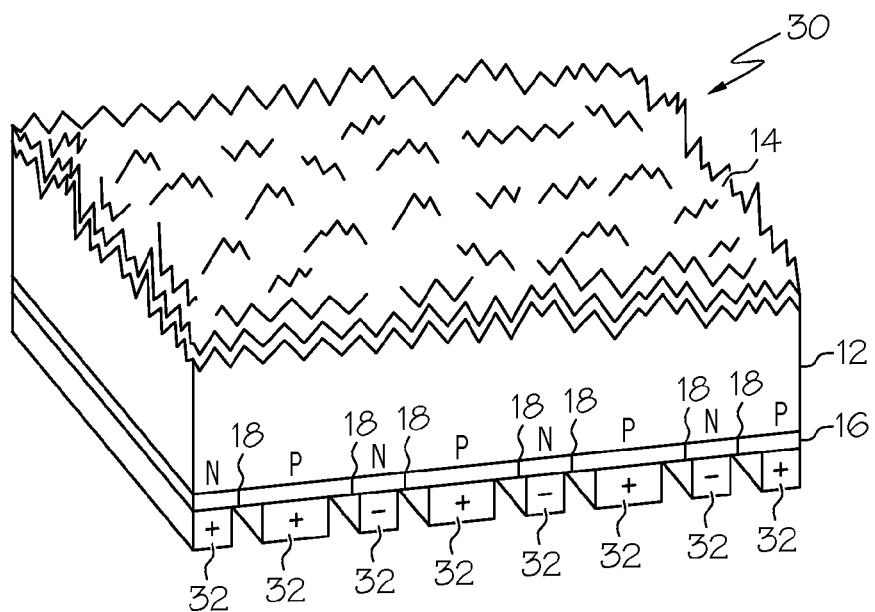
FIG. 2 is a schematic illustration of another conventional solar cell with back side contacts.
Figure 3:
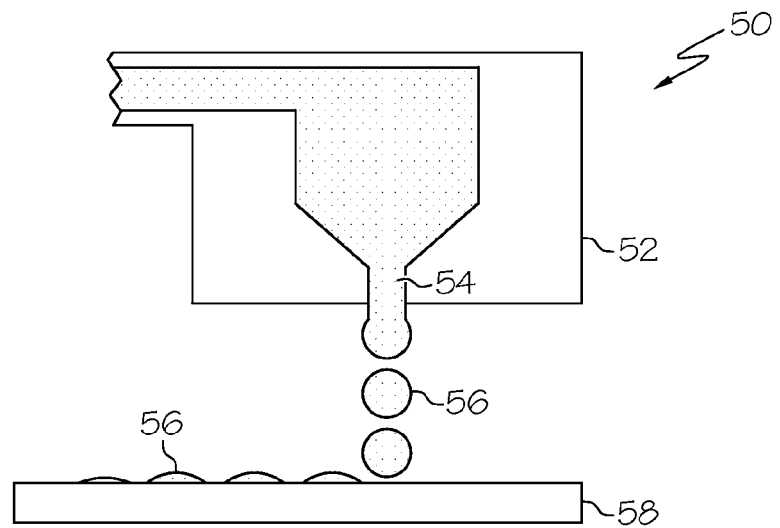
FIG. 3 is a cross-sectional view of an inkjet printer mechanism distributing ink on a substrate.
Figure 4:
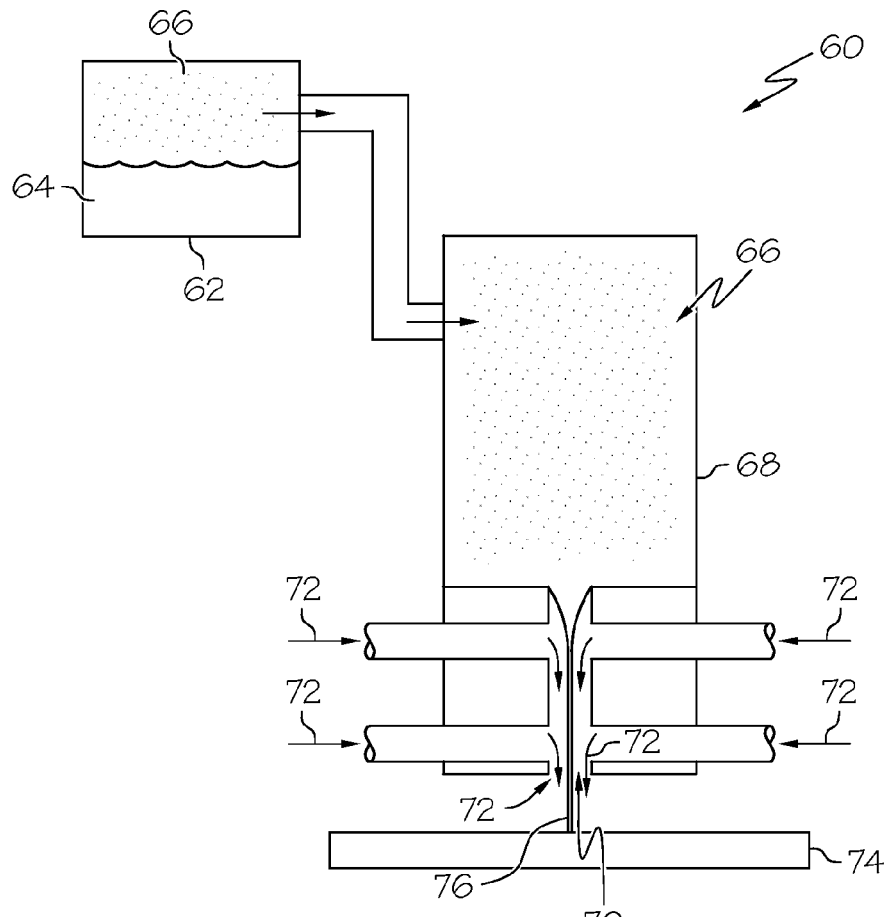
FIG. 4 is a cross-sectional view of an aerosol jet printer mechanism distributing ink on a substrate.

Boron-comprising inks for forming boron-doped regions in semiconductor substrates using non-contact printing processes and methods for fabricating such boron-comprising inks are provided herein. As used herein, the term "non-contact printing process" means a process for depositing a liquid conductivity-determining type dopant selectively on a semiconductor material in a predetermined patterned without the use of a mask, screen, or other such device. Examples of non-contact printing processes include but are not limited to "inkjet printing" and "aerosol jet printing." Typically, the terms "inkjet printing," an "inkjet printing process," "aerosol jet printing," and an "aerosol jet printing process" refer to a non-contact printing process whereby a liquid is projected from a nozzle directly onto a substrate to form a desired pattern. In an inkjet printing mechanism 50 of an inkjet printer, as illustrated in FIG. 3, a print head 52 has several tiny nozzles 54, also called jets. As a substrate 58 moves past the print head 52, or as the print head 52 moves past the substrate, the nozzles spray or "jet" ink 56 onto the substrate in tiny drops, forming images of a desired pattern. In an aerosol jet printing mechanism 60, illustrated in FIG. 4, a mist generator or nebulizer 62 atomizes a liquid 64. The atomized fluid 66 is aerodynamically focused using a flow guidance deposition head 68, which creates an annular flow of sheath gas, indicated by arrow 72, to collimate the atomized fluid 66. The co-axial flow exits the flow guidance head 68 through a nozzle 70 directed at the substrate 74 and focuses a stream 76 of the atomized material to as small as a tenth of the size of the nozzle orifice (typically 100 μm). Patterning is accomplished by attaching the substrate to a computer-controlled platen, or by translating the flow guidance head while the substrate position remains fixed.

Such non-contact printing processes are particularly attractive processes for fabricating doped regions in semiconductor substrates for a variety of reasons. First, unlike screen printing or photolithography, only an ink used to form the doped regions touches or contacts the surface of the substrate upon which the ink is applied. Thus, because the breaking of semiconductor substrates could be minimized compared to other known processes, non-contact printing processes are suitable for a variety of substrates, including rigid and flexible substrates. In addition, non-contact printing processes are additive processes, meaning that the ink is applied to the substrate in the desired pattern. Thus, steps for removing material after the printing process, such as are required in photolithography, are eliminated. Further, because non-contact printing processes are additive processes, they are suitable for substrates having smooth, rough, or textured surfaces. Non-contact printing processes also permit the formation of very fine features on semiconductor substrates. In one embodiment, features, such as, for example, lines, dots, rectangles, circles, or other geometric shapes, having at least one dimension of less than about 200 μm can be formed. In another exemplary embodiment, features having at least one dimension of less than about 100 μm can be formed. In a preferred embodiment, features having at least one dimension of less than about 20 μm can be formed. In addition, because non-contact printing processes involve digital computer printers that can be programmed with a selected pattern to be formed on a substrate or that can be provided the pattern from a host computer, no new masks or screens need to be produced when a change in the pattern is desired. All of the above reasons make non-contact printing processes cost-efficient processes for fabricating doped regions in semiconductor substrates, allowing for increased throughput compared to screen printing and photolithography.

Figure 5:
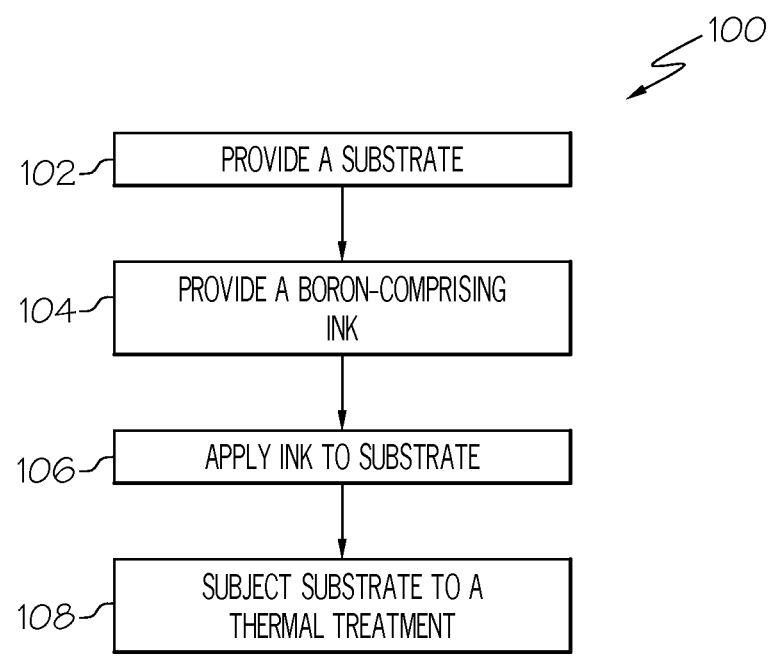
FIG. 5 is a flowchart of a method for forming boron-doped regions in a semiconductor substrate using an non-contact printing process in accordance with an exemplary embodiment of the present invention.

Referring to FIG. 5, a method 100 for forming a boron-doped region in a semiconductor substrate includes the step of providing a semiconductor substrate (step 102). As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor substrate" encompasses other semiconductor materials such as relatively pure and impurity-doped germanium, gallium arsenide, and the like. In this regard, the method 100 can be used to fabricate a variety semiconductor devices including, but not limited to, microelectronics, solar cells, displays, RFID components, microelectromechanical systems (MEMS) devices, optical devices such as microlenses, medical devices, and the like.

The method 100 further includes the step of providing an ink formed of or from a boron-comprising material (hereinafter, a "boron-comprising ink") (step 104), which step may be performed before, during or after the step of providing the semiconductor substrate. Methods for fabricating a boron-comprising ink are described in more detail in reference to FIGS. 6-9. The boron-comprising ink should meet at least one of several performance criteria for non-contact printing. First, the ink is formulated so that it can be printed to form fine or small features, such as lines, dots, circles, squares, or other geometric shapes. In one exemplary embodiment of the invention, the ink is formulated so that features having at least one dimension of less than about 200 µm can be printed. In another exemplary embodiment of the invention, the ink is formulated so that features having at least one dimension less than about 100 µm can be printed. In a preferred embodiment of the present invention, the ink is formulated so that features having a dimension of less than about 20 µm can be printed.

Second, during the printing process and during pausing of the printing process, the ink results in minimal, if any, clogging of the non-contact printer nozzles. Clogging of the nozzles results in down-time of the printer, thus reducing throughput. In one exemplary embodiment, the boron-comprising ink has a viscosity in the range of about 1.5 to about 50 centipoise (cp). Further, the ink is formulated so that, after it is deposited on the substrate and high-temperature annealing (discussed in more detail below) is performed, the resulting doped region has a sheet resistance in the range of about 10 to about 100 ohms/square ($\Omega/\Box$).

Moreover, the ink is formulated so that the boron and/or the boron-comprising ink do not significantly diffuse from the penned area, that is, the area upon which the ink is deposited, into unpenned areas before the high temperature anneal is performed. Significant diffusion of the boron and/or the boron-comprising ink from the penned area, either by vapor transport or by diffusion through the substrate, before annealing at the proper annealing temperature may significantly adversely affect the electrical properties of devices comprising the resulting doped regions. The boron-comprising ink also is formulated so that significant diffusion of the boron from the penned area into unpenned areas during the annealing process is minimized or prevented altogether. In other words, localized doping, in contrast to blanket doping, is desirably effected. Significant diffusion of the boron from the penned area into unpenned areas, either by vapor transport or by diffusion through the substrate during the annealing process, should be minimized or eliminated so as to achieve localized doping without significantly changing the boron distribution outside of the penned area. In addition, the ink provides for shallow but highly concentrated doping, with a post-anneal doping depth in the range of from about 0.1 to about 1 micrometers (µm) and a boron concentration in the range of about $1\times10^{19}$ to $1\times10^{20}$ atoms/cm$^3$.

The boron-comprising ink is applied to the substrate using a non-contact printer (step 106). The boron-comprising ink is applied to the substrate in a pattern that is stored in or otherwise supplied to the printer. Examples of inkjet printers suitable for use include, but are not limited to, Dimatix Inkjet Printer Model DMP 2811 available from Fujifilm Dimatix, Inc. of Santa Clara, Calif. An example of an aerosol jet printer suitable for use includes, but is not limited to, an M3D Aerosol Jet Deposition System available from Optomec, Inc. of Albuquerque, N.Mex. Preferably, the ink is applied to the substrate at a temperature in the range of about 15° C. to about 80° C. in a humidity of about 20 to about 80%. Once the pattern of boron-comprising ink is formed on the substrate, the substrate is subjected to a high-temperature thermal treatment or "anneal" to cause the boron of the boron-comprising ink to diffuse into the substrate, thus forming boron-doped regions within the substrate (step 108). The time duration and the temperature of the anneal is determined by such factors as the initial boron concentration of the boron-comprising ink, the thickness of the ink deposit, the desired concentration of the resulting boron-doped region, and the depth to which the boron is to diffuse. In one exemplary embodiment of the present invention, the substrate is placed inside an oven wherein the temperature is ramped up to a temperature in the range of about 800° C. to about 1200° C. and the substrate is baked at this temperature for about 2 to about 90 minutes. Annealing also may be carried out in an in-line furnace to increase throughput. The annealing atmosphere may contain 0-100% oxygen in an oxygen/nitrogen or oxygen/argon mixture. In a preferred embodiment, the substrate is subjected to an anneal temperature of about 1050° C. for about ten (10) minutes in an oxygen ambient.

Figure 6:
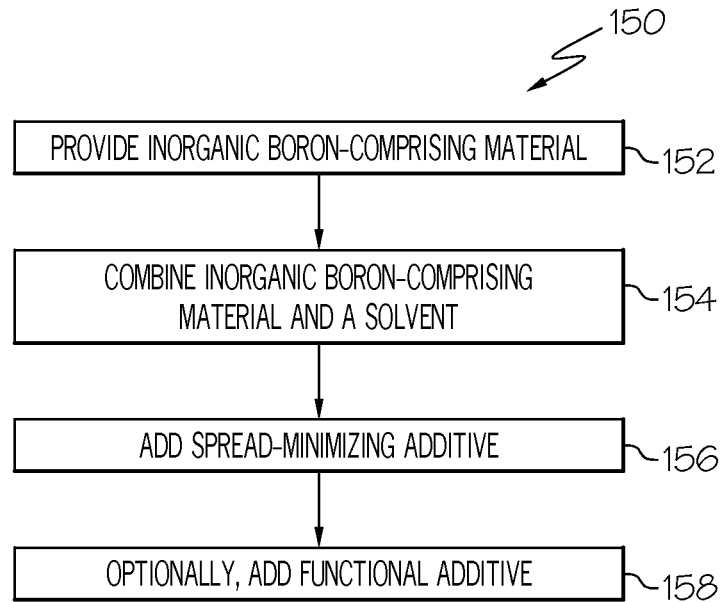
FIG. 6 is a flowchart of a method for fabricating a boron-comprising ink for use in the method of FIG. 5 in accordance with an exemplary embodiment of the present invention.

Boron-comprising inks used in the method of FIG. 5 may be manufactured using a variety of boron-contributing materials. In accordance with one exemplary embodiment of the present invention, the boron-comprising ink may be formed from a boron-comprising material. Referring to FIG. 6, in accordance with an exemplary embodiment of the present invention, a method 150 for fabricating a boron-comprising ink includes the step of providing a boron-comprising material (step 152). Boron-comprising materials for use in method 150 include, but are not limited to, boric acid (B(OH)$_3$), boron oxide (B$_2$O$_3$), and other borates having the formula B(OR)$_3$, where R is an alkyl group, such as, for example, a methyl, ethyl, or propyl group, or a combination thereof.

The method further includes combining the boron-comprising material with a polar solvent. Polar solvents suitable for use comprise any suitable polar pure fluid or mixture of fluids that is capable of forming a solution with the boron-comprising material and that causes the boron-comprising ink to have a viscosity in the range of about 1.5 to about 50 cp. In some contemplated embodiments, the solvent or solvent mixture may comprise those solvents that are not considered part of the hydrocarbon solvent family of compounds, such as alcohols, ketones (such as acetone, diethylketone, methylethylketone, and the like), esters, ethers, amides and amines. Examples of solvents suitable for use in formulating the boron-comprising ink include alcohols, such as methanol, ethanol, propanol, butanol, and pentanol, anhydrides, such as acetic anhydride, and other solvents such as propylene glycol monoether acetate and ethyl lactate, and mixtures thereof. The boron-comprising material may be combined with the polar solvent using any suitable mixing or stirring process that forms a homogeneous mixture. For example, a reflux condenser, a low speed sonicator or a high shear mixing apparatus, such as a homogenizer, a microfluidizer, a cowls blade high shear mixer, an automated media mill, or a ball mill, may be used for several seconds to an hour or more to combine the components.

In preferred embodiment of the invention, the boron-comprising material is combined with at least one polar solvent having a high boiling point in the range of about 50° C. to about 250° C. In this regard, the boiling point of the resulting dopant-comprising ink is modified to minimize the drying rate of the ink and, thus, minimize clogging of the printer nozzles. Examples of solvents with high boiling points suitable for use include ethanol, iso-stearic acid, propylene glycol butyl ether, ethylene glycol, triethylene glycol, and the like, and combinations thereof.

In another exemplary embodiment, a spread-minimizing additive is added (step 156). The spread-minimizing additive is an additive that modifies the surface tension and/or wettability of the boron-comprising ink so that spreading of the ink when penned onto the substrate is minimized. In a preferred embodiment of the invention, the boron-comprising ink has a spreading factor in the range of from about 1.5 to about 6. The term "spreading factor" of a non-contact printing process ink is defined in terms of an inkjet printing process and is the ratio of the average diameter of a dot of the ink deposited by a nozzle of an inkjet printer to the diameter of the nozzle when the semiconductor substrate is at a temperature in a range of from 50° C. to about 60° C., the temperature of the ink at the nozzle is in a range of about 20° C. to about 22° C., the distance between the tip of the nozzle proximate to the substrate and the substrate is about 1.5 millimeters (mm) and the jetting frequency, that is, the number of ink drops jetted from the nozzle per second, is 2 kilohertz (kHz). By minimizing the spreading of the ink on the substrate, fine features, such as those described above having at least one feature that is less than about 200 µm or smaller, can be achieved. Examples of spread-minimizing additives include, but are not limited to, iso-stearic acid, polypropylene oxide (PPO), such as polypropylene oxide having a molecular weight of 4000 (PPO4000), vinylmethylsiloxane-dimethylsiloxane copolymer, such as VDT131 available form Gelest, Inc. of Tullytown, Pennsylvania, polyether-modified polysiloxanes, such as Tegophren 5863 available from Evonik Degussa GmbH of Essen, Germany, other organo-modified polysiloxanes, such as Tegoglide 420 also available from Evonik Degussa GmbH, and the like, and combinations thereof.

In an optional exemplary embodiment of the invention, a functional additive is added to the boron-comprising material before, during, or after combination with the solvent (step 158). For example, it may be desirable to minimize the amount of the resulting boron and/or boron-comprising ink that diffuses beyond the penned area into unpenned areas of the substrate before the predetermined annealing temperature of the annealing process is reached. As noted above, diffusion of the boron and/or boron-comprising ink beyond the penned area into unpenned areas before annealing can significantly affect the electrical characteristics of the resulting semiconductor device that utilizes the subsequently-formed doped region. Thus, in a further exemplary embodiment, a viscosity modifier that results in the boron-comprising ink having a viscosity in the range of about 1.5 to about 50 cp is added. Preferably, the resulting boron-comprising ink is soluble in the viscosity modifier. Examples of such viscosity-modifiers include glycerol, polyethylene glycol, polypropylene glycol, ethylene glycol/propylene glycol copolymer, organo-modified siloxanes, ethylene glycol/siloxane copolymers, polyelectrolyte, oleic acid and the like, and combinations thereof. Examples of other suitable additives that may be added to the boron-comprising material include dispersants, surfactants, polymerization inhibitors, wetting agents, antifoaming agents, detergents and other surface-tension modifiers, flame retardants, pigments, plasticizers, thickeners, rheology modifiers, and mixtures thereof.

Figure 7:
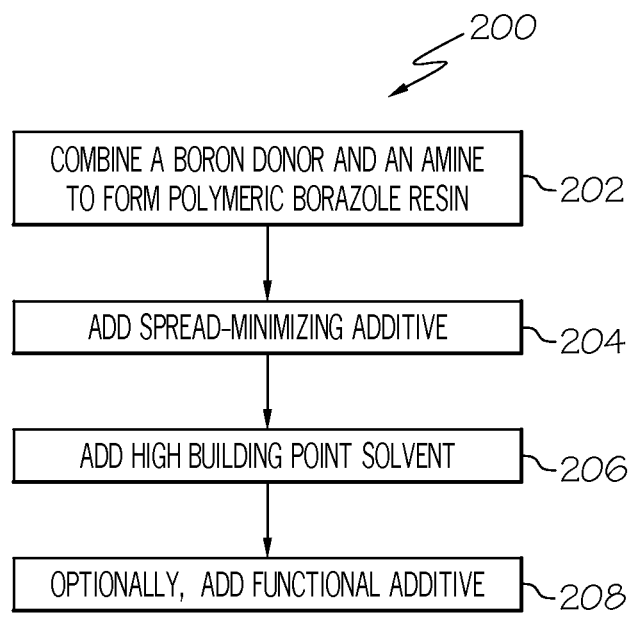
FIG. 7 is a flowchart of a method for fabricating a boron-comprising ink for use in the method of FIG. 5 in accordance with another exemplary embodiment of the present invention.

In accordance with another exemplary embodiment of the present invention, the boron-comprising ink may be formed so that it comprises a polymeric borazole (PBZ) resin. Referring to FIG. 7, in accordance with an exemplary embodiment of the present invention, a method 200 for fabricating a boron-comprising ink comprising a PBZ resin includes the step of combining a boron donor and an amine to form a PBZ resin (step 202). The boron donor may comprise boron halides such as boron trichloride ($BCl_3$), boron tribromide ($BBr_3$), and boron trifluoride ($BF_3$), and alkylboron compounds such as boron trifluoride etherate ($CH_3CH_2)OBF_3$, methyldichloroboron (($CH_3)BCl_2$), and the like, and combinations thereof The amine may comprise an alkylamine such as, for example, cyclohexylamine, butylamine, hexylamine, dipropylamine, tripropylamine, and combinations thereto. In one exemplary embodiment, the boron donor and the amine are combined at temperatures in the range of about −60° C. and about −5° C. to form an intermediate triaminoborane and amine hydrochloride salt. In another exemplary embodiment, the boron donor and the amine are combined in the presence of an inert, non-polar solvent or solvent mixture with a relatively low boiling point. Examples of suitable inert solvents include low boiling point hydrocarbon solvents such as pentane, hexane, heptane, and octane, which have a boiling point of less than about 100° C. The solvent may be added first to the boron donor, first to the amine, or may be added when the boron donor and the amine are combined.

Figure 8:
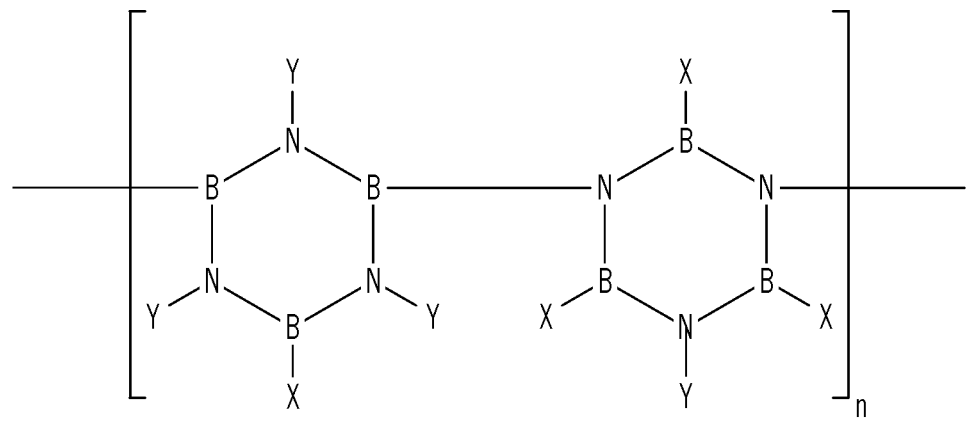
FIG. 8 is an illustration of the molecular structure of a polymer borazole resin formed in accordance with the method of FIG. 7.

The reaction mixture is filtered to remove the amine hydrochloride salt to obtain a solution containing the triaminoborane intermediate. The low boiling point solvent in the solution then is evaporated to produce a neat triaminoborane. In one exemplary embodiment, the solvent is heated under nitrogen atmosphere to about 300° C. for about one to about two hours and then further heated to about 380° C. to about 420° C. for about two to about four hours. Upon completion of the polymerization reaction, a PBZ resin having the molecular structure illustrated in FIG. 8 is formed, where X and Y can be hydrogen, a halogen such as chlorine, a hydroxyl group, an alkyl group, an aryl group, or a cycloalkyl group and n is a number in the range of from about 5 to about 100.

Referring back to FIG. 7, in accordance with one exemplary embodiment of the invention, once formed the PBZ resin can be isolated, such as by filtering the PBZ resin from solution, and a spread-minimizing additive is added thereto (step 204). Any of the above-described spread-minimizing additives may be used. The polymeric borazole resin also is combined with at least one solvent having a high boiling point in the range of about 50° C. to about 250° C. (step 206). In this regard, the boiling point of the resulting boron-comprising ink is adjusted to minimize the drying rate of the ink. Examples of solvents with high boiling points suitable for use include any of the high boiling point non-polar solvents. In some contemplated embodiments, the solvent or solvent mixture comprises aliphatic, cyclic, and aromatic hydrocarbons. Aliphatic hydrocarbon solvents may comprise both straightchain compound and compounds that are branched. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally benzene or naphthalene structures. Contemplated hydrocarbon solvents include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, and ligroine.

In an optional embodiment of the present invention, other functional additives also may be added to the PBZ resin (step 208). For example, a viscosity modifier can be added to cause the resulting boron-comprising ink to have a viscosity in the range of about 1.5 to about 50 cp. An example of a viscosity modifier suitable for use in preparing the boron-comprising ink includes, but is not limited to, polypropylene glycol. Any of the other above-described functional additives also may be added. While FIG. 7 illustrates that the step of adding a functional additive (step 208) is performed after the step of adding a high boiling-point solvent (step 206) and after the step of adding a spread-minimizing additive (step 204), it will be appreciated that the functional additive can be added before, during, or after the step of adding the spread-minimizing additive (step 204) and/or before, during, or after the step of adding the high boiling-point solvent (step 206).

Figure 9:
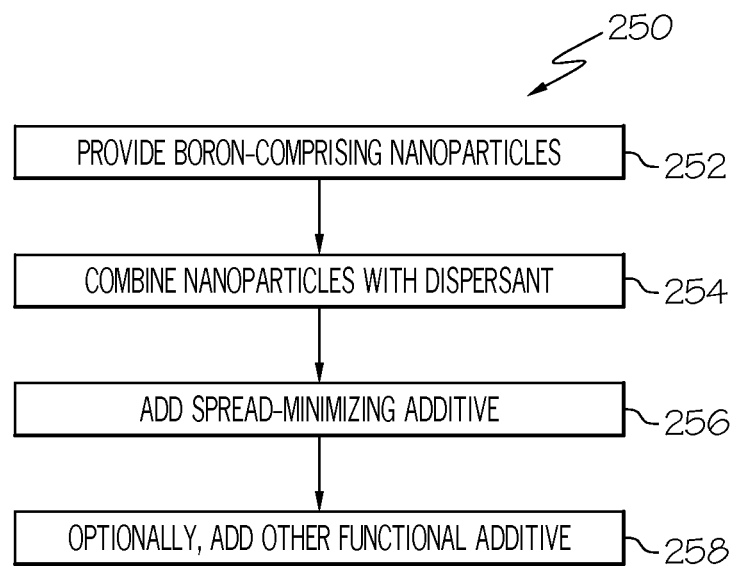
FIG. 9 is a flowchart of a method for fabricating a boron-comprising ink for use in the method of FIG. 5 in accordance with yet another exemplary embodiment of the present invention.

In accordance with a further exemplary embodiment of the present invention, the boron-comprising ink may be formed from boron-comprising nanoparticles. Referring to FIG. 9, in accordance with an exemplary embodiment of the present invention, a method 250 for fabricating a boron-comprising ink includes the step of providing boron-comprising nanoparticles (step 252). Examples of boron-comprising nanoparticles suitable for fabricating a boron-comprising ink include, but are not limited to, boron oxide nanoparticles, boron nitride nanoparticles, boron carbide nanoparticles, and boron (metal) nanoparticles. In one exemplary embodiment, the boron-comprising nanoparticles have an average dimension, such as an average diameter, length, or width, that is no greater than 100 nm. In a preferred embodiment, the boron-comprising nanoparticles have an average dimension of no larger than about 10 nm. A smaller size of nanoparticle facilitates less tendency for clogging and more uniform distribution of the boron-comprising ink.

The method 250 further includes combining the boron-comprising nanoparticles with at least one dispersant that forms a uniform and stable suspension with the nanoparticles and does not dissolve the nanoparticles (step 254). In one exemplary embodiment, a dispersant that stabilizes the nanoparticles by adjusting the pH of the nanoparticles so that they are alkaline, that is, with a pH greater than about 7, is combined with the nanoparticles. An example of such a dispersant includes, but is not limited to, ammonium hydroxide, sodium hydroxide, and tetramethylammonium hydroxide. In this regard, at least a portion of the boron on the surface of the nanoparticles forms $BO^-NH_4^+$, which prevents agglomeration of the nanoparticles by electrostatic repulsion. In another exemplary embodiment, a dispersant that stabilizes the nanoparticles with organic groups is combined with the nanoparticles. Examples of such dispersants include, but are not limited to, alkylchlorosilanes, trialkylchlorosilanes, acetyl chloride, acetyl anhydride, and alkylalkoxysilanes. In this regard, at least a portion of the boron on the surface of the nanoparticles forms stable $B-O-SiR_3$, $B-O-R$, or $B-O-COR$, where R is an alkyl or alkoxy group. In a further exemplary embodiment, a dispersant that stabilizes the nanoparticles by charging the nanoparticles is combined therewith. Examples of such dispersants include, but are not limited to, aminoalkylalkoxy silanes. In this regard, at least a portion of the boron on the surface of the nanoparticles forms $B-O-SiR_2NH_2$, where R is an alkyl or alkoxy group. The nanoparticles then can be further stabilized by protonation. Protonation can be achieved by adding an acid, such as, for example, nitric acid, to form $B-O-SiR_2NH_3^+$. The dispersant also may comprise a combination of the stabilizing dispersants described above. The nanoparticles and the dispersant are mixed using any suitable mixing or agitation process that facilitates formation of a homogeneous and stable suspension, such as any of the suitable methods described above. Heat also may be used to facilitate formation of the suspension.

A spread-minimizing additive also is added to the boron-comprising nanoparticles (step 256). Any of the above-described spread-minimizing additives may be used. While FIG. 9 illustrates that the step of adding the spread-minimizing additive (step 256) is performed after the step of combining the nanoparticles with the dispersant (step 254), it will be appreciated that the spread-minimizing additive also may be added to the nanoparticles before or during the step of combining the nanoparticles with the dispersant. The nanoparticles, with or without reaction with a dispersant, and the spread-minimizing additive are mixed using any suitable mixing or agitation process that facilitates formation of a homogeneous and stable suspension, such as any of the suitable methods described above. Heat also may be used to facilitate formation of the suspension.

In an optional exemplary embodiment of the invention, one or more other functional additives may be added to the nanoparticles before, during, or after combination with the dispersant (step 258). Examples of other suitable additives that may be added include dispersants, surfactants, polymerization inhibitors, wetting agents, antifoaming agents, detergents and other surface-tension modifiers, flame retardants, pigments, plasticizers, thickeners, viscosity modifiers, rheology modifiers, and mixtures thereof. While FIG. 9 illustrates that the step of adding one or more other functional additives (step 258) is performed after the step of adding the spread-minimizing additive (step 256), it will be appreciated that the other functional additive(s) may be added to the nanoparticles before, during, or after the step of combining the nanoparticles with the dispersant (step 254).

The following are examples of methods for fabricating boron-comprising inks for use in forming boron-doped regions of semiconductor substrates using non-contact printing processes. The examples are provided for illustration purposes only and are not meant to limit the various embodiments of the present invention in any way.

EXAMPLE 1

In an exemplary embodiment of the present invention, a boron-comprising ink was prepared by dissolving about 3.5 grams (gm) boric acid in about 46.5 gm ethanol. The solution was spun onto a four-inch n-type wafer at 500 revolutions per minute (rpm) with no baking. The coated wafer was heated at 1050° C. for 10 minutes in 2.5% oxygen. The wafer was deglazed using 20:1 diluted hydrofluoric acid (DHF). Sheet resistance after deglazing, measured using a four-point probe test, was 75 ohms/sq.

EXAMPLE 2

In an exemplary embodiment of the present invention, a boron-comprising ink was prepared by dissolving about 3.51 gm boron oxide in about 46.5 gm ethanol. The solution was spun onto a four-inch n-type wafer at 500 rpm with no baking. The coated wafer was heated at 1050° C. for 10 minutes in 2.5% oxygen. The wafer was deglazed using 20:1 DHF. Sheet resistance after deglazing, measured using a four-point probe test, was 82 ohms/sq.

EXAMPLE 3

A polymeric borazole (PBZ) resin was prepared from a high temperature polymerization of boron trichloride and cyclohexylamine. A PBZ solution A ink then was prepared by dissolving 450 gm PBZ resin in 1060 gm toluene. About 160 gm cyclohexylamine was added and mixed thoroughly. The final PBZ solution A ink had a solid content of about 37%.

A PBZ solution B ink was prepared by mixing 450 gm PBZ solution A ink with 400 gm toluene and 40 gm cyclohexylamine.

The PBZ solution B ink was spun onto a four-inch n-type wafer at a spin speed of 1000 rpm with no baking. The coated wafer was then heated to 1050° C. for 30 minutes in 2.5% oxygen. The film thickness was about 204 nm. The sheet resistance after deglazing in 20:1 DHF was 14.8 ohms/sq.

The PBZ solution B ink also was spun onto a four-inch n-type wafer at a spin speed of 1000 rpm with no baking. The coated wafer then was heated to 950° C. for 30 minutes in air. The sheet resistance after deglazing in 20:1 DHF was 47 ohms/sq.

EXAMPLE 4

An ink comprising 20.6 weight percent (wt. %) PBZ resin formed as described in Example 3, 55.9 wt. % xylene, 14.7 wt. % cyclohexylamine and 8.8 wt % polypropylene glycol (molecular weight of 4000) was prepared. The viscosity of the ink was 11.6 cp. The solution was spun onto a four-inch n-type wafer at 1000 rpm with no baking. The coated wafer was heated to about 1050° C. in air and held at 1050° C. for about 15 minutes. The wafer was deglazed in 20:1 DHF. The sheet resistance after deglazing as measured using a four-point probe test was 10.6 ohm/sq. An area of 2 centimeters (cm) by 2 cm was printed using a Dimatix Inkjet Printer Model DMP 2811 with a nozzle having a 21 micrometer μm diameter.

EXAMPLE 5

An ink comprising 63.5 wt. % PBZ resin formed as described in Example 3 and 36.5 wt. % xylene was prepared. The viscosity of the solution was about 7.0 cp. A film was print-coated onto a four-inch n-type wafer using a Dimatix Inkjet Printer Model DMP 2811. The printed wafer was heated to about 1050° C. in about 15% oxygen and held at that temperature for about 30 minutes. The wafer was deglazed in 20:1 DHF. Sheet resistance of the printed areas was 18.9 ohms/sq.

EXAMPLE 6

An ink comprising 93.3 wt. % PBZ solution B ink formed as described in Example 3 and 16.7 wt. % oleic acid was prepared. Viscosity of the solution was about 3.4 cp. The solution was spun onto a four-inch n-type wafer at 1000 rpm with baking at 80° C. for one minute, 170° C. for one minute, and 250° C. for one minute. The coated wafer then was heated to 1050° C. in 15% oxygen and held at that temperature for 30 minutes. Film thickness before deglazing was about 32.3 nm. The wafer was deglazed in 20:1 DHF. Sheet resistance as measured by a four-point probe test was about 26.6 ohms/sq.

EXAMPLE 7

An ink comprising about 90 wt. % PBZ solution B ink formed as described in Example 3 and about 10 wt. % oleic acid was prepared. The viscosity of the resulting ink was 2.2 cp. The solution was spun onto a four-inch n-type wafer at 1000 rpm with baking at 80° C. for one minute, 170° C. for one minute, and 250° C. for one minute. The coated wafer was heated to 1050° C. in 15% oxygen and held at that temperature for about 30 minutes. Film thickness before deglazing was about 275.7 nm. The wafer was deglazed in 20:1 DHF. Sheet resistance as measured by a four-point probe test was 33.8 ohms/sq.

EXAMPLE 8

An ink comprising 36.6 wt. % PBZ resin formed as described in Example 3, 10.9 wt. % cyclohexylamine and 52.8 wt. % xylene was prepared. The solution was spun onto a four-inch wafer at a spin speed of 1000 rpm with no baking. The coated wafer was heated to 950° C. for 30 minutes in air. The wafer was deglazed in 20:1 DHF. Sheet resistance after deglazing was 51 ohms/sq.

Accordingly, boron-comprising inks for forming boron-doped regions in semiconductor substrates using non-contact printing and methods for fabricating such boron-comprising inks have been provided. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A boron-comprising ink, for a non-contact printing process, the boron-comprising ink comprising:
    boron from or of a boron-comprising material selected from the group consisting of boron oxide, boric acid, borates having a formula $B(OR)_3$, where R is an alkyl group, and combinations thereof; and
    a spread-minimizing additive that results in a spreading factor of the boron-comprising ink in a range of from about 1.5 to about 6;
    wherein for a non-contact printing process the boron-comprising ink has a viscosity in a range of from about 1.5 to about 50 centipoise and, when deposited on a semiconductor substrate, provides a post-anneal sheet resistance in a range of from about 10 to about 100 ohms/square, a post-anneal doping depth in a range of from about 0.1 to about 1 μm, and a boron concentration in a range of from about $1\times10^{19}$ to $1\times10^{20}$ atoms/cm$^3$.

2. The boron-comprising ink of claim 1, further comprising a polar solvent having a boiling point in a range of from about 50° C. to about 250° C.

3. The boron-comprising ink of claim 2, wherein the polar solvent comprises a material selected from the group consisting of iso-stearic acid, ethanol, propylene glycol butyl ether, ethylene glycol, triethylene glycol, and mixtures thereof.

4. The boron-comprising ink of claim 1, further comprising a viscosity modifier, dispersants, surfactants, polymerization inhibitors, wetting agents, antifoaming agents, detergents and other surface-tension modifiers, flame retardants, pigments, plasticizers, thickeners, rheology modifiers, or mixtures thereof.

5. The boron-comprising ink of claim 1, wherein the spread-minimizing additive comprises a material selected from the group consisting of iso-stearic acid, polypropylene oxide (PPO), vinylmethylsiloxane-dimethylsiloxane copolymer, polyether-modified polysiloxanes, organo-modified polysiloxanes, and combinations thereof.

6. The boron-comprising ink for a non-contact printing process:
   a polymeric borazole resin; and
   a spread-minimizing additive that results in a spreading factor of the boron-comprising ink in a range of from about 1.5 to about 6;
   wherein for a non-contact printing process the boron-comprising ink has a viscosity in a range of from about 1.5 to less than 50 centipoise and, when deposited on a semiconductor substrate, provides a post-anneal sheet resistance in a range of from about 10 to about 100 ohms/square, a post-anneal doping depth in a range of from about 0.1 to about 1 µm, and a boron concentration in a range of from about $1 \times 10^{19}$ to $1 \times 10^{20}$ atoms/cm$^3$.

7. The boron-comprising ink of claim 6, further comprising a polar solvent having a boiling point in a range of from about 50° C. to about 250° C.

8. The boron-comprising ink of claim 6, wherein the polar solvent is chosen from the group comprising ethanol, iso-stearic acid, propylene glycol butyl ether, ethylene glycol, triethylene glycol, and mixtures thereof.

9. The boron-comprising ink of claim 6, further comprising a viscosity modifier, dispersant, surfactant, polymerization inhibitor, wetting agent, antifoaming agent, detergent or other surface-tension modifier, flame retardant, pigment, plasticizer, thickener, rheology modifier, or mixture thereof.

10. The boron-comprising ink of claim 6, wherein the spread-minimizing additive comprises a material chosen from the group comprising iso-stearic acid, polypropylene oxide (PPO), vinylmethylsiloxane-dimethylsiloxane copolymer, polyether-modified polysiloxanes, organo-modified polysiloxanes, and combinations thereof.

11. The boron-comprising ink for a non-contact printing process comprising:
   boron from or of boron-comprising nanoparticles; and
   a spread-minimizing additive that results in spreading factor of the boron-comprising ink in a range of from about 1.5 to about 6;
   wherein for a non-contact printing process the boron-comprising ink has a viscosity in a range of from about 1.5 to less than 50 centipoise and, when deposited on a semiconductor substrate, provides a post-anneal sheet resistance in a range of from about 10 to about 100 ohms/square, a post-anneal doping depth in a range of from about 0.1 to about 1 µm, and a boron concentration in a range of from about $1 \times 10^{19}$ to $1 \times 10^{20}$ atoms/cm$^3$.

12. The boron-comprising ink of claim 11, wherein the boron-comprising nanoparticles have an average dimension no greater than about 100 nm.

13. The boron-comprising ink of claim 11, further comprising a dispersant.

14. The boron-comprising ink of claim 11, further comprising a viscosity modifier, dispersant, surfactant, polymerization inhibitor, wetting agent, antifoaming agent, detergent or other surface-tension modifier, flame retardant, pigment, plasticizer, thickener, rheology modifier, or mixture thereof.

15. The boron-comprising ink of claim 11, wherein the spread-minimizing additive comprises a material chosen from the group comprising iso-stearic acid, polypropylene oxide (PPO), vinylmethylsiloxane-dimethylsiloxane copolymer, polyether-modified polysiloxanes, organo-modified polysiloxanes, and combinations thereof.

16. The boron-comprising ink of claim 11, wherein the boron-comprising nanoparticles are chosen from the group comprising boron oxide nanoparticles, boron nitride nanoparticles, boron carbide nanoparticles, and boron (metal) nanoparticles.

17. The boron-comprising ink of claim 13, wherein the dispersant is chosen from the group comprising ammonium hydroxide, sodium hydroxide, tetramethylammonium hydroxide, alkylchlorosilanes, trialkylchlorosilanes, acetyl chloride, acetyl anhydride, alkyalkoxysilanes, and aminoalkylalkoxy silanes.

* * * * *